(12) United States Patent
Savage et al.

(10) Patent No.: US 9,767,951 B2
(45) Date of Patent: Sep. 19, 2017

(54) LIQUID CRYSTAL INDUCTOR ENHANCED WITH MAGNETIC NANOPARTICLES

(71) Applicant: The Boeing Company, Chicago, IL (US)

(72) Inventors: Larry Leon Savage, Huntsville, AL (US); John D. Williams, Decatur, AL (US); Corey McKinney Thacker, Madison, AL (US); Jarrod Douglas Fortinberry, Somerville, AL (US); Preston Tyler Bushey, Hampton Cove, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/793,094

(22) Filed: Jul. 7, 2015

(65) Prior Publication Data
US 2017/0011835 A1  Jan. 12, 2017

(51) Int. Cl.
*H03H 7/38* (2006.01)
*H01F 21/08* (2006.01)
*H03H 7/01* (2006.01)
*H01F 27/24* (2006.01)
*H01F 27/28* (2006.01)
*H01F 27/29* (2006.01)
*H01F 27/255* (2006.01)

(52) U.S. Cl.
CPC ............ *H01F 21/08* (2013.01); *H01F 27/24* (2013.01); *H01F 27/255* (2013.01); *H01F 27/28* (2013.01); *H01F 27/29* (2013.01); *H03H 7/0115* (2013.01); *H03H 7/38* (2013.01)

(58) Field of Classification Search
CPC .......... H01F 21/08; H01F 27/28; H01F 27/19; H03H 7/0115; H03H 7/38
USPC .......................................... 333/32
See application file for complete search history.

(56) References Cited

U.S. PATENT DOCUMENTS

| 8,922,301 | B1 | 12/2014 | Williams et al. |
| 9,059,496 | B2 * | 6/2015 | Glushchenko ............ H01P 1/18 |
| 9,306,562 | B2 * | 4/2016 | Bacaksiz ............... H03K 17/955 |
| 2013/0169401 | A1 * | 7/2013 | Lee .......................... H01F 27/29 336/192 |
| 2014/0022029 | A1 | 1/2014 | Glushchenko et al. |

FOREIGN PATENT DOCUMENTS

| IE | WO 2012123072 A1 * | 9/2012 | ................ H01P 1/18 |
| JP | 2013120761 A * | 6/2013 | |
| JP | 2013120761 A1 | 6/2013 | |

OTHER PUBLICATIONS

Williams, "Tunable Bandpass Filter for Communication System," U.S. Appl. No. 14/528,644, filed Apr. 13, 2015, 27 pages.

(Continued)

*Primary Examiner* — Robert Pascal
*Assistant Examiner* — Kimberly Glenn
(74) *Attorney, Agent, or Firm* — Yee & Associates, P.C.

(57) ABSTRACT

A method and apparatus for managing a magnetic permeability of a core. The apparatus comprises a core and a plurality of electrodes positioned relative to the core. The core comprises a plurality of liquid crystals and a plurality of magnetic nanoparticles. Changing a voltage applied to the plurality of electrodes changes a magnetic permeability of the core.

16 Claims, 13 Drawing Sheets

(56) References Cited

OTHER PUBLICATIONS

Kamali-Sarvestani et al., "Fabrication of High Quality Factor RF-Solenoids Using Via Structures," IEEE Wireless and Microwave Technology Conference, Apr. 2011, 4 pages.
Kamali-Sarvestani et al., "Design and Fabrication of Monolithic High Quality Factor RF-Solenoids Using Dielectric Substrate," Microwave Journal, Technical Feature, Nov. 2011, pp. 76-90.
Kamali-Sarvestani et al., "New High Quality Factor Solenoid Based Tuned Resonator," IEEE International Microwave Symposium Digest, Jun. 2011, 4 pages.
Mertelj et al., "Ferromagnetism in suspensions of magnetic platelets in liquid crystal," Macmillan Publishers Limited, Nature, vol. 504, Dec. 2013, 11 pages.
Gregoire, "Two-Dimensionally Electronically-Steerable Artificial Impedance Surface Antenna," U.S. Appl. No. 13/961,967, filed Aug. 8, 2013, 66 pages.
Patel et al., "Two-Dimensionally Electronically-Steerable Artificial Impedance Surface Antenna," U.S. Appl. No. 14/682,643, filed Apr. 9, 2015, 105 pages.
Extended European Search Report, Dated Dec. 22, 2016, Regarding Application No. 16171010.8, 6 pages.

\* cited by examiner

LIQUID CRYSTAL INDUCTOR ENHANCED WITH MAGNETIC NANOPARTICLES

BACKGROUND INFORMATION

1. Field

The present disclosure relates generally to inductors and, in particular, to adjustable inductors. Still more particularly, the present disclosure relates to a method and apparatus for varying the inductance of an inductor having a core comprised of liquid crystals enhanced by magnetic nanoparticles.

2. Background

In certain systems, capacitance values and inductance values within a circuit may be varied to provide desired system performance. Varying capacitance and varying inductance may be particularly useful in radio frequency applications that require impedance matching and filtering.

For example, performing impedance matching and filtering over a wide range of frequencies in a manner that does not compromise system performance may be more difficult than desired. However, this issue may be overcome using adaptive impedance matching and filtering. For example, without limitation, changing one or more capacitance values, one or more inductance values, or both within an impedance matching and filtering circuit may enable adaptive impedance matching and filtering.

Some currently available circuit configurations for varying inductance and capacitance include using switched combinations of fixed-value circuit components. For example, a switched configuration of multiple fixed-value inductors may be used to provide variable inductance. Similarly, a switched configuration of multiple fixed-value capacitors may be used to provide variable capacitance.

However, these types of switched configurations of circuit components may be unable to adapt as quickly as desired. For example, with a switched configuration of multiple fixed-value inductors, changes in inductance may occur more slowly than desired. Further, with this type of switched configuration, the range of adaptability and performance may be limited by the fixed inductance values of the individual inductors. Still further, this type of switched configuration may be larger and heavier than desired and may require more power than desired. Therefore, it would be desirable to have a method and apparatus that take into account at least some of the issues discussed above, as well as other possible issues.

SUMMARY

In one illustrative example, an apparatus comprises a core and a plurality of electrodes positioned relative to the core. The core comprises a plurality of liquid crystals and a plurality of magnetic nanoparticles. Changing a voltage applied to the plurality of electrodes changes a magnetic permeability of the core.

In another illustrative example, an apparatus comprises an adjustable inductor. The adjustable inductor comprises a core, a plurality of electrodes positioned relative to the core, and a conductor disposed around the core. The core comprises a fluid mixture of a plurality of liquid crystals and a plurality of magnetic nanoparticles. Changing a voltage applied to the plurality of electrodes changes a magnetic permeability of the core and thereby, an inductance of the conductor.

In yet another illustrative example, a method for managing a magnetic permeability of a core is provided. A voltage is applied to a plurality of electrodes positioned relative to the core. The core comprises a plurality of liquid crystals and a plurality of magnetic nanoparticles. The voltage applied to the plurality of electrodes is changed. The magnetic permeability of the core changes as the voltage applied to the plurality of electrodes changes.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account different considerations. For example, the illustrative embodiments recognize and take into account that it may be desirable to have a method and apparatus for providing variable inductance in a circuit network without increasing the weight of the circuit network, the size of the circuit network, the complexity of the circuit network, or the power used by the circuit network more than desired. Further, it may be desirable to have a method and apparatus that allow inductance to be varied quickly.

The illustrative embodiments recognize and take into account that a combination of liquid crystals and magnetic nanoparticles may be used to form an adjustable inductor. Liquid crystals are matter that is in a state that has properties between those of liquid and those of solid crystal. Liquid crystals may be inherently anisotropic. For example, without limitation, liquid crystals may have an anisotropic geometric shape, such as a rod-type shape, a cigar-type shape, or some other type of anisotropic shape.

In particular, the illustrative embodiments further recognize and take into account that liquid crystals may be mixed with magnetic nanoparticles to form a core for an adjustable inductor. Applying a potential difference across this type of core may force the liquid crystals to align substantially parallel to the longitudinal axis of the core. This alignment of the liquid crystals may, in turn, force co-alignment of the magnetic nanoparticles with the liquid crystals.

In this manner, a magnetic path may be created through the magnetic nanoparticles across the length of the core. Changing the potential difference across the core may change the magnetic permeability of the core, which may, in turn, change the inductance of a conductor that is wrapped around but dielectrically separated from the core. Thus, the illustrative embodiments provide a method and apparatus for managing a magnetic permeability of a core of an adjustable inductor, to thereby manage the inductance of the adjustable inductor.

Figure 1:
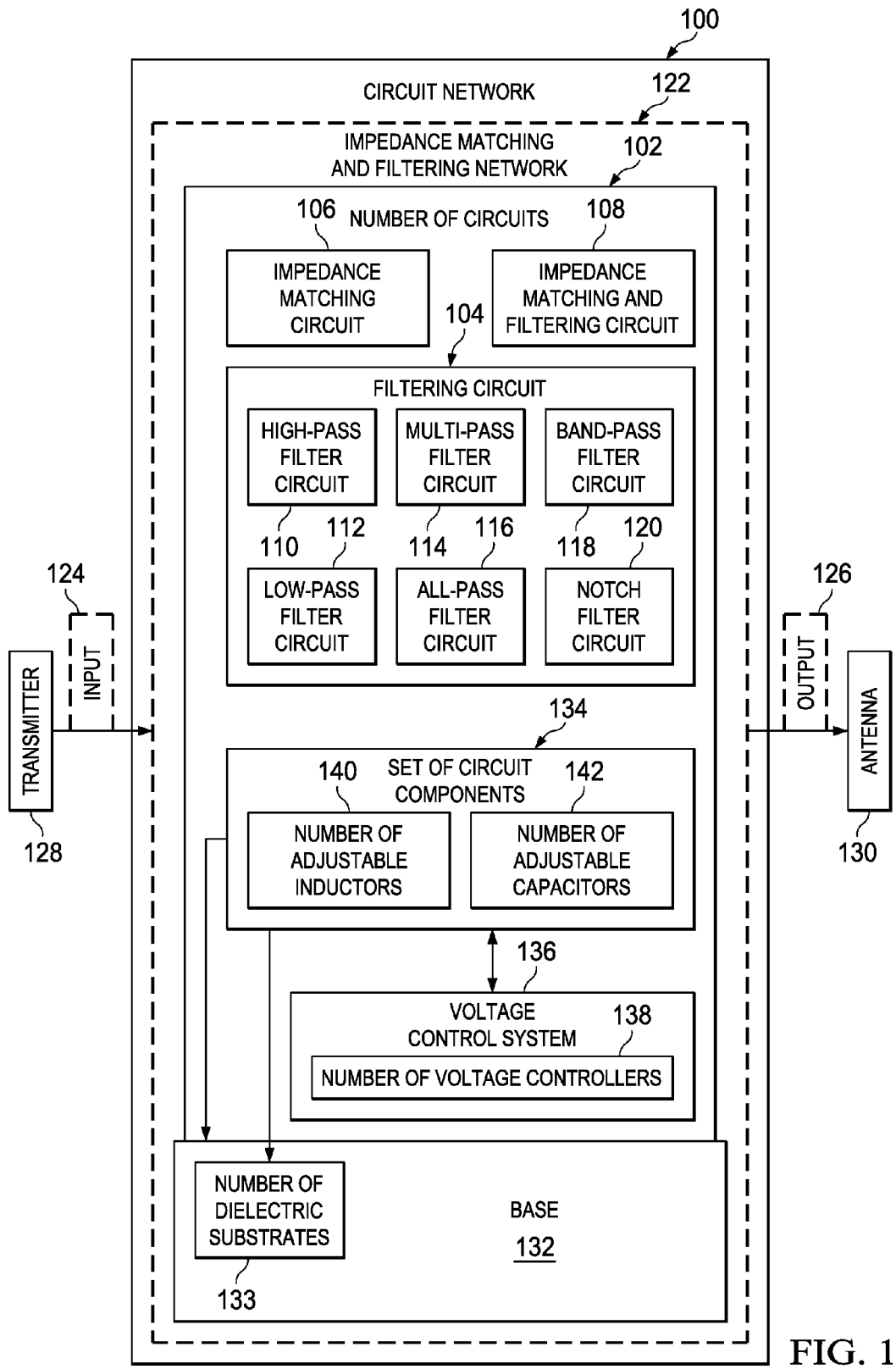
FIG. 1 is an illustration of an electromagnetic system that includes a number of adjustable inductors in the form of a block diagram in accordance with an illustrative embodiment.

Referring now to the figures and, in particular, with reference to FIG. 1, an illustration of an electromagnetic system that includes a number of adjustable inductors is depicted in the form of a block diagram in accordance with an illustrative embodiment. In this illustrative example, circuit network 100 may include number of circuits 102. As used herein, a "number of" items may include one or more items. In this manner, number of circuits 102 may include one or more circuits.

For example, without limitation, number of circuits 102 may include at least one of filtering circuit 104, impedance matching circuit 106, impedance matching and filtering circuit 108, or some other type of circuit. Depending on the implementation, filtering circuit 104 may comprise at least one of high-pass filter circuit 110, low-pass filter circuit 112, multi-pass filter circuit 114, all-pass filter circuit 116, band-pass filter circuit 118, notch filter circuit 120, or some other type of filter circuit.

As used herein, the phrase "at least one of," when used with a list of items, means different combinations of one or more of the listed items may be used and only one of the items in the list may be needed. The item may be a particular object, thing, step, operation, process, or category. In other words, "at least one of" means any combination of items or number of items may be used from the list, but not all of the items in the list may be required.

For example, without limitation, "at least one of item A, item B, or item C" or "at least one of item A, item B, and item C" may mean item A; item A and item B; item A, item B, and item C; or item B and item C. In some cases, "at least one of item A, item B, or item C" or "at least one of item A, item B, and item C" may mean, but is not limited to, two of item A, one of item B, and ten of item C; four of item B and seven of item C; or some other suitable combination.

In one illustrative example, circuit network 100 takes the form of impedance matching and filtering network 122. Impedance matching and filtering network 122 may receive input 124 and may generate output 126 based on input 124. In this illustrative example, number of circuits 102 may be used to perform impedance matching and filtering for input 124.

As one illustrative example, input 124 may be the output signal generated by transmitter 128. Transmitter 128 may be, for example, without limitation, a radio frequency (RF) transmitter. Impedance matching and filtering network 122 may filter input 124 such that only frequencies lower than a selected frequency threshold are allowed to pass through impedance matching and filtering network 122. Further, the impedance of the load of antenna 130 may be matched to the impedance of transmitter 128 using impedance matching and filtering network 122 to improve power transfer between transmitter 128 and antenna 130.

As depicted, number of circuits 102 may be at least partially formed on base 132. Base 132 may be comprised of dielectric material. Dielectric material may be a medium or substance that is capable of transmitting electric force without conduction. In this manner, dielectric material may be considered an insulating material. Base 132 may include number of dielectric substrates 133, depending on the implementation. Each dielectric substrate of number of dielectric substrates 133 may take the form of a thin piece, slice, or plate of dielectric material.

Number of circuits 102 may include set of circuit components 134 and voltage control system 136. Voltage control system 136 may include number of voltage controllers 138. Each of number of voltage controllers 138 may be configured to generate a voltage that is adjustable.

Set of circuit components 134 may be implemented on base 132. As one illustrative example, each individual circuit component of set of circuit components 134 may be implemented on a corresponding dielectric substrate of number of dielectric substrates 133. In this manner, this corresponding dielectric substrate may serve as a base for the individual circuit component.

A circuit component in set of circuit components 134 may take the form of a fixed-value inductor, an adjustable inductor, a fixed-value capacitor, an adjustable capacitor, a switch device, a fixed-value resistor, an adjustable resistor, or some other type of electronic device. In these illustrative examples, set of circuit components 134 includes number of adjustable inductors 140. In some cases, set of circuit components 134 may also include number of adjustable capacitors 142.

An example of one manner in which an adjustable inductor of number of adjustable inductors 140 may be implemented is described in greater detail in FIG. 2 below. Further, an example of one manner in which an adjustable capacitor of number of adjustable capacitors 142 may be implemented is described in greater detail in FIG. 3 below.

In one illustrative example, circuit network 100 may be implemented using one or more liquid crystal inductors enhanced with magnetic nanoparticles and one or more liquid crystal capacitors. Using these types of liquid crystal circuit components may enable circuit network 100 to be made sufficiently small for certain applications. For example, circuit network 100 may be made less than about 2 square centimeters. In some illustrative examples, circuit network 100 may be made less than about 1 square centimeter.

Further, this type of circuit network 100 may be capable of being used for high radio frequency applications. For example, without limitation, circuit network 100 may be capable of being used for applications at microwave radio frequencies. Circuit network 100 may be used in applications operating at frequencies between, for example, without limitation, about 2 gigahertz (GHz) and about 30 gigahertz (GHz).

Figure 2:
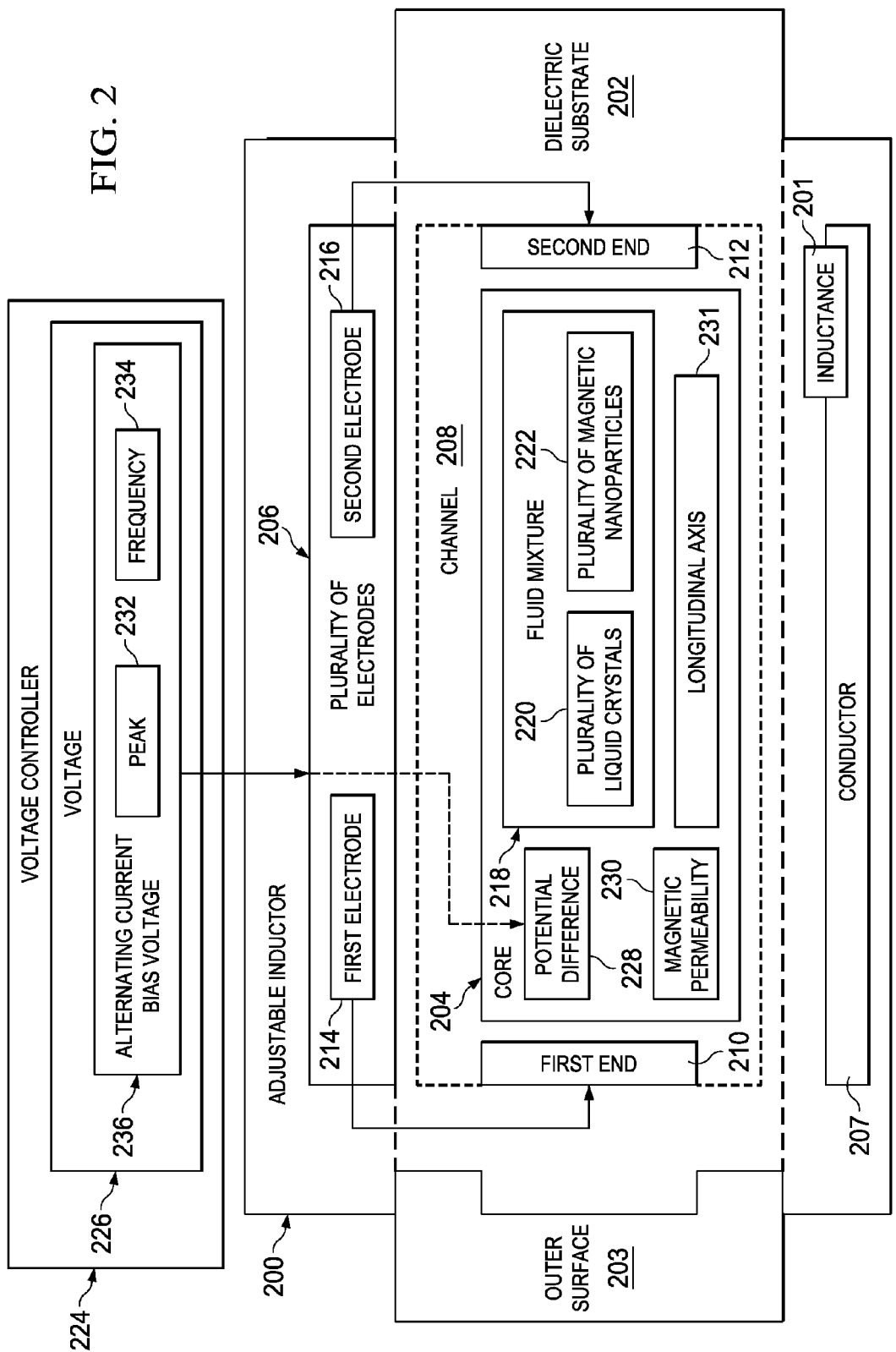
FIG. 2 is an illustration of an adjustable inductor in the form of a block diagram in accordance with an illustrative embodiment.

With reference now to FIG. 2, an illustration of an adjustable inductor is depicted in the form of a block diagram in accordance with an illustrative embodiment. In this illustrative example, adjustable inductor 200 may be an example of one implementation for one of number of adjustable inductors 140 in FIG. 1. Adjustable inductor 200 has inductance 201 that can be varied.

In this illustrative example, dielectric substrate 202 may serve as a base for adjustable inductor 200. Dielectric substrate 202 may be an example of one of number of dielectric substrates 133 described in FIG. 1. In this illustrative example, adjustable inductor 200 may be physically associated with dielectric substrate 202.

As depicted, dielectric substrate 202 may have outer surface 203. At least a portion of adjustable inductor 200 may be coupled to outer surface 203 of dielectric substrate 202.

In one illustrative example, adjustable inductor 200 includes core 204, plurality of electrodes 206 positioned relative to core 204, and conductor 207. Core 204 may be located in channel 208 within dielectric substrate 202. Dielectric substrate 202 may serve as a base for plurality of electrodes 206 and conductor 207.

As depicted, channel 208 has first end 210 and second end 212. Depending on the implementation, first end 210, second end 212, or both may be open. In some cases, both first end 210 and second end 212 are closed such that channel 208 forms a reservoir or cavity within dielectric substrate 202. In one illustrative example, dielectric substrate 202 may be printed using a three-dimensional printer or formed in layers such that channel 208 is formed within dielectric substrate 202.

Plurality of electrodes 206 may be associated with dielectric substrate 202. Plurality of electrodes 206 may be positioned relative to channel 208, and thereby core 204 located within channel 208. For example, without limitation, plurality of electrodes 206 may include first electrode 214 and second electrode 216. First electrode 214 and second electrode 216 may be positioned at first end 210 and second end 212, respectively, of channel 208.

In one illustrative example, first electrode 214 and second electrode 216 may be associated with dielectric substrate 202 at first end 210 and second end 212, respectively, of channel 208. In another illustrative example, first electrode 214 and second electrode 216 may be printed onto dielectric substrate 202 at first end 210 and second end 212, respectively, of channel 208.

Core 204 is located within channel 208 between first electrode 214 and second electrode 216. In this illustrative example, core 204 is comprised of fluid mixture 218. Fluid mixture 218 may comprise plurality of liquid crystals 220 and plurality of magnetic nanoparticles 222.

Plurality of liquid crystals 220 may inherently have anisotropic geometry. In other words, each of plurality of liquid crystals 220 may have a geometry that is directionally dependent. For example, without limitation, each liquid crystal of plurality of liquid crystals 220 may have a rod-type shape, a cigar-type shape, an oblate shape, or some other type of elongated shape.

Plurality of magnetic nanoparticles 222 may be dispersed among plurality of liquid crystals 220. Plurality of magnetic nanoparticles 222 belong to a class of nanoparticles that can be manipulated using magnetic field gradients. A magnetic nanoparticle of plurality of magnetic nanoparticles 222 may comprise at least one of iron, nickel, cobalt, some other type of magnetic element, or a chemical compound that includes at least one of iron, nickel, cobalt, a ferromagnetic material, or some other type of magnetic element. In some illustrative examples, nanoparticles may include a silica or polymer protective coating to protect against chemical or electrochemical corrosion.

In one illustrative example, plurality of magnetic nanoparticles 222 take the form of a plurality of ferromagnetic nanoparticles. These ferromagnetic nanoparticles may take the form of a plurality of nanoferrite particles. Further, such nanoparticles may comprise nanoferrite particles, barium ferrite particles, or other suitable ferrite materials.

Conductor 207 is disposed around core 204. Together, core 204, plurality of electrodes 206, and conductor 207 form an inductor, which may be adjustable inductor 200. In particular, conductor 207 is disposed around a portion of outer surface 203 of dielectric substrate 202 such that conductor 207 is physically located around core 204 but dielectrically separated from core 204 by dielectric substrate 202. Conductor 207 may take the form of one or more pieces of conductive material that are disposed around core 204 but dielectrically separated from core 204. In particular, conductor 207 may include at least one of a conductive wire, a conductive line, a via, a conductive coating, conductive plating, a layer of conductive material, or some other type of conductive material.

In one illustrative example, conductor 207 may be implemented such that conductor 207 forms a "coil" that wraps around but is dielectrically separated from core 204. For example, without limitation, conductor 207 may include a first set of conductive lines on a first side of outer surface 203 of dielectric substrate 202, a second set of conductive lines on a second side of outer surface 203 that is opposite to the first side, and a set of vias that pass through dielectric substrate 202 to connect the first set of conductive lines to the second set of conductive lines. This type of configuration for conductor 207 may resemble a coil.

Inductance 201 of adjustable inductor 200 may be the inductance of conductor 207. Inductance 201 may be varied using voltage controller 224. Voltage controller 224 is used to generate voltage 226. Voltage 226 is applied to plurality of electrodes 206. Voltage controller 224 may be an example of one of number of voltage controllers 138 in FIG. 1. In particular, voltage controller 224 applies voltage 226 to plurality of electrodes 206 to create potential difference 228 across core 204 between plurality of electrodes 206.

Potential difference 228 across core 204 may determine magnetic permeability 230 of core 204. In turn, magnetic permeability 230 of core 204 may determine inductance 201 of adjustable inductor 200. Voltage controller 224 is configured to adjust voltage 226. For example, voltage controller 224 may adjust voltage 226 by changing at least one of peak 232 of voltage 226 or frequency 234 of voltage 226. In other words, peak 232, frequency 234, or both may be changed to adjust voltage 226.

Changing voltage 226 changes potential difference 228 across core 204, which, in turn, changes magnetic permeability 230, which, in turn, changes inductance 201. For example, when voltage 226 is applied to plurality of electrodes 206 to create potential difference 228 across core 204, plurality of liquid crystals 220 are forced into alignment. In particular, plurality of liquid crystals 220 may be aligned substantially parallel to longitudinal axis 231 of core 204. Longitudinal axis 231 may be the axis along core 204 extending from first electrode 214 to second electrode 216. The percentage of liquid crystals in plurality of liquid crystals 220 that align with longitudinal axis 231 may depend on peak 232 and frequency 234 of voltage 226.

Alignment of plurality of liquid crystals 220 forces co-alignment of plurality of magnetic nanoparticles 222, which affects magnetic permeability 230 of core 204. In particular, co-alignment of plurality of magnetic nanoparticles 222 with plurality of liquid crystals 220 provides a net change in magnetic permeability 230 of core 204 between first electrode 214 and second electrode 216.

When an electric current is sent through conductor 207, a magnetic field is created. Magnetic permeability 230 of core 204 affects the magnetic field produced by conductor 207, which affects inductance 201. Inductance 201 may be a measure of the resistance of conductor 207 to a change in the electric current that passes through conductor 207.

As magnetic permeability 230 of core 204 increases, the magnetic field that is created also increases, which leads to greater magnetic flux. Greater magnetic flux results in higher inductance 201. Conversely, as magnetic permeability 230 of core 204 decreases, the magnetic field that is created by conductor 207 decreases, which leads to lower magnetic flux. Lower magnetic flux results in lower inductance 201. In this manner, inductance 201 may be adjusted by adjusting voltage 226.

In one illustrative example, voltage 226 takes the form of alternating current (AC) bias voltage 236. Alternating current bias voltage 236 may be used to help avoid undesired electrochemical reactions within fluid mixture 218. In particular, using alternating current (AC) bias voltage 236 may help prevent an electrochemical reaction that would degrade or cause deterioration of plurality of electrodes 206.

Depending on the implementation, dielectric substrate 202, adjustable inductor 200 implemented in association with dielectric substrate 202, or both may be fabricated using three-dimensional printing. For example, without limitation, this three-dimensional printing may be performed using at least one of micro dispense pumping, fused deposition modeling, stereolithography, selective laser sintering, selective laser modeling, ink deposition, or some other type of additive manufacturing or three-dimensional printing technology. In other illustrative examples, dielectric substrate 202, adjustable inductor 200 implemented in association with dielectric substrate 202, or both may be implemented using at least one of a three-dimensional additive manufacturing method, a multilayer printed circuit board fabrication method, a multilayer microfabrication process, or some other type of fabrication process.

Figure 3:
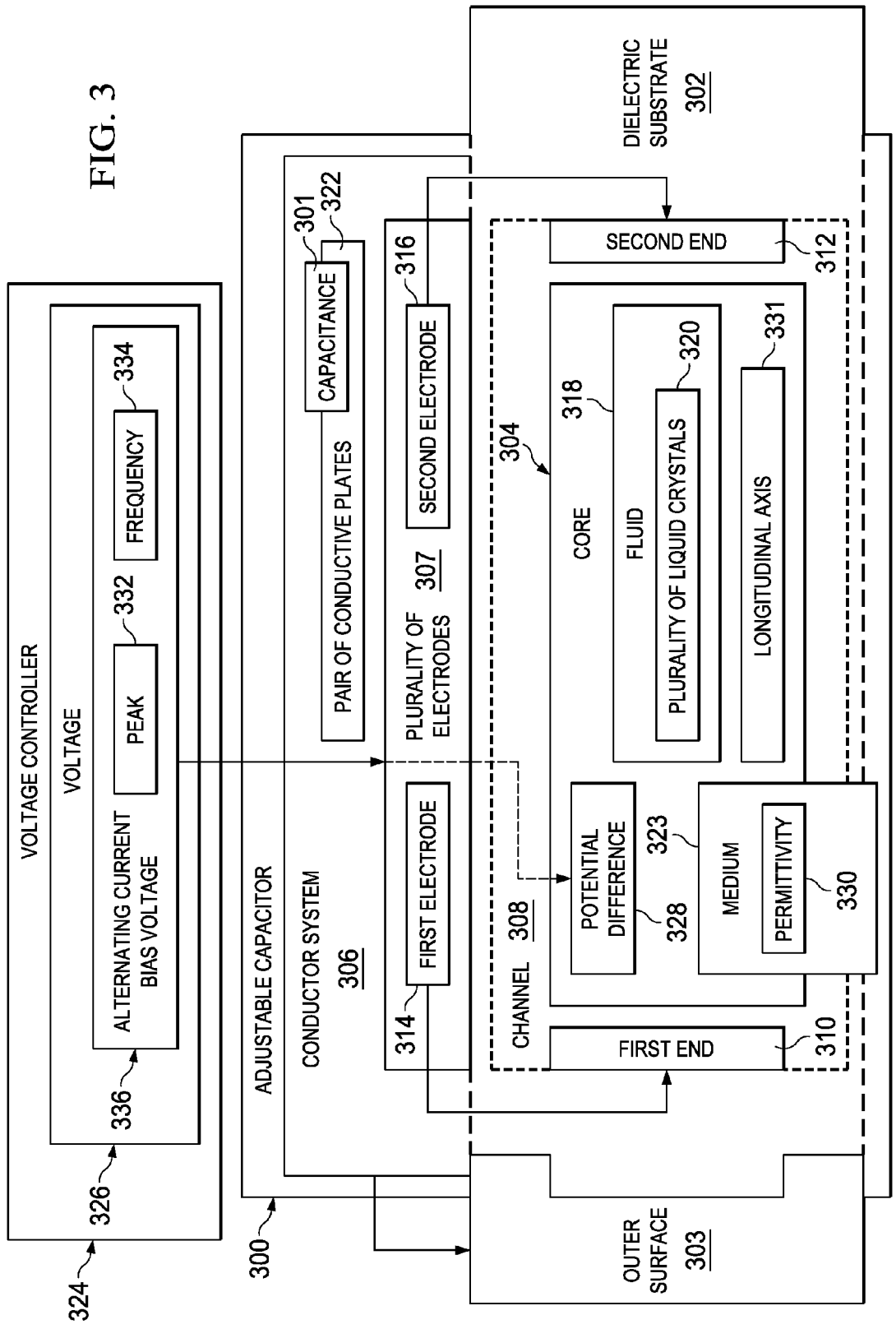
FIG. 3 is an illustration of an adjustable capacitor in the form of a block diagram in accordance with an illustrative embodiment.

With reference now to FIG. 3, an illustration of an adjustable capacitor is depicted in the form of a block diagram in accordance with an illustrative embodiment. In this illustrative example, adjustable capacitor 300 may be an example of one implementation for one of number of adjustable capacitors 142 in FIG. 1. Adjustable inductor 300 has capacitance 301 that can be varied.

In this illustrative example, dielectric substrate 302 may serve as a base for adjustable capacitor 300. Dielectric substrate 302 may be an example of one of number of dielectric substrates 133 described in FIG. 1. In this illustrative example, adjustable capacitor 300 may be physically associated with dielectric substrate 302.

As depicted, dielectric substrate 302 may have outer surface 303. At least a portion of adjustable capacitor 300 may be coupled to outer surface 303 of dielectric substrate 302.

In one illustrative example, adjustable capacitor 300 includes core 304 and conductor system 306. Core 304 may be located in channel 308 within dielectric substrate 302. Core 304 may also be referred to as a capacitor core.

As depicted, channel 308 has first end 310 and second end 312. Depending on the implementation, first end 310, second end 312, or both may be open. In some cases, both first end 310 and second end 312 are closed such that channel 308 forms a reservoir or cavity within dielectric substrate 302. In one illustrative example, dielectric substrate 302 may be printed using a three-dimensional printer or formed in layers such that channel 308 is formed within dielectric substrate 302.

Conductor system 306 is disposed around core 304. In one illustrative example, conductor system 306 includes plurality of electrodes 307, which may be associated with dielectric substrate 302. In particular, dielectric substrate 302 may serve as a base for plurality of electrodes 307. Plurality of electrodes 307 may be positioned relative to channel 308. For example, without limitation, plurality of electrodes 307 may include first electrode 314 and second electrode 316. First electrode 314 and second electrode 316 may be positioned at first end 310 and second end 312, respectively, of channel 308.

In one illustrative example, first electrode 314 and second electrode 316 may be associated with dielectric substrate 302 at first end 310 and second end 312, respectively, of channel 308. In another illustrative example, first electrode 314 and second electrode 316 may be printed onto dielectric substrate 302 at first end 310 and second end 312, respectively, of channel 308.

Core 304 is located within channel 308 between first electrode 314 and second electrode 316. In this illustrative example, core 304 is comprised of fluid 318. Fluid 318 may comprise plurality of liquid crystals 320.

Plurality of liquid crystals 320 may inherently have anisotropic geometry. In other words, each of plurality of liquid crystals 320 may have a geometry that is directionally dependent. For example, without limitation, each liquid crystal of plurality of liquid crystals 320 may have a rod-type shape, a cigar-type shape, an oblate shape, or some other type of elongated shape.

In these illustrative examples, conductor system 306 may also include pair of conductive plates 322 disposed around core 304. In particular, pair of conductive plates 322 may be positioned along outer surface 303 of dielectric substrate 302 around core 304 such that each of pair of conductive plates 322 is physically located around core 304 but dielectrically separated from core 304 by dielectric substrate 302. The portion of dielectric substrate 302 and the portion of core 304 between pair of conductive plates 322 form medium 323.

Capacitance 301 of adjustable capacitor 300 may be the capacitance of pair of conductive plates 322. Capacitance 301 may be the ability of pair of conductive plates 322 to store an electric charge. Pair of conductive plates 322 may be arranged such that the conductive plates are parallel to each other and on opposite sides of core 304. For example, a first conductive plate may be positioned at a first side of outer surface 303, while a second conductive plate may be positioned at a second side of outer surface 303.

Capacitance 301 of adjustable capacitor 300 may be varied using voltage controller 324. Voltage controller 324 is used to generate voltage 326. Voltage 326 is applied to plurality of electrodes 307. Voltage controller 324 may be an example of one of number of voltage controllers 138 in FIG. 1. In particular, voltage controller 324 applies voltage 326 to plurality of electrodes 307 to create potential difference 328 across core 304 between plurality of electrodes 307.

Potential difference 328 across core 304 may determine permittivity 330 of medium 323 between pair of conductive plates 322. In some cases, permittivity 330 may also be referred to as electric field permittivity. Permittivity 330 of medium 323 may determine capacitance 301 of adjustable capacitor 300.

For example, voltage controller 324 may adjust voltage 326 by changing at least one of peak 332 of voltage 326 or frequency 334 of voltage 326. Changing voltage 326 changes potential difference 328 across core 304, which, in turn, changes permittivity 330, which, in turn, changes capacitance 301.

In particular, when voltage 326 is applied to plurality of electrodes 307 to create potential difference 328 across core 304, plurality of liquid crystals 320 are forced into alignment. In particular, plurality of liquid crystals 320 may be aligned substantially parallel to longitudinal axis 331 of core 304. Longitudinal axis 331 may be the axis along core 304 extending from first electrode 314 to second electrode 316. The percentage of liquid crystals in plurality of liquid crystals 320 that align with longitudinal axis 331 may depend on peak 332 and frequency 334 of voltage 326.

Alignment of plurality of liquid crystals 320 produces a net change in permittivity 330 of medium 323. When an electric current is sent through conductor system 306, an electric field is created. Permittivity 330 of medium 323 affects the electric field produced by conductor system 306, which affects capacitance 301.

For example, permittivity 330 of medium 323 may be a measure of the ability to transmit an electric field. More specifically, permittivity 330 may describe how much electric flux may be generated per unit charge in medium 323. As permittivity 330 of medium 323 increases, the same charge may be stored between pair of conductive plates 322 with a smaller electric field, and thereby a lower voltage, which may result in increased capacitance 301. Conversely, as permittivity 330 of medium 323 decreases, storing the same charge between pair of conductive plates 322 may require a larger electric field, and thereby a higher voltage, which may result in decreased capacitance 301.

In one illustrative example, voltage 326 takes the form of alternating current (AC) bias voltage 336. Alternating current bias voltage 336 may be used to help avoid undesired electrochemical reactions within fluid 318. In particular, using alternating current (AC) bias voltage 336 may help prevent an electrochemical reaction that would degrade or cause deterioration of plurality of electrodes 307.

Depending on the implementation, dielectric substrate 302, adjustable inductor 300 implemented in association with dielectric substrate 302, or both may be fabricated using at least one of a three-dimensional additive manufacturing method, a multilayer printed circuit board fabrication method, a multilayer microfabrication process, or some other type of fabrication process. In one illustrative example, without limitation, a micro dispense pumping system may be used to perform three-dimensional printing.

Adjustable capacitor 300 may be capable of providing circuit temperature compensation. For example, without limitation, capacitance 301 may vary, or drift, based on temperature. The temperature coefficient of capacitance (TCC) of adjustable capacitor 300 describes the maximum change in capacitance 301 over a particular temperature range. The dielectric material that makes up dielectric substrate 302 and the type of plurality of liquid crystals 320 used in adjustable capacitor 300 may be selected to counteract temperature drift of capacitance 301.

In some illustrative examples, multiple capacitors may be used to compensate for temperature drift. For example, without limitation, a first adjustable capacitor having a positive temperature coefficient of capacitance may be combined with a second adjustable capacitor having a negative temperature coefficient of capacitance.

The illustration of circuit network 100 in FIG. 1, adjustable inductor 200 in FIG. 2, and adjustable capacitor 300 in FIG. 3 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

In other illustrative examples, conductor system 306 may include only pair of conductive plates 322 and may not include plurality of electrodes 307. In these examples, voltage controller 324 may apply voltage 326 directly to pair of conductive plates 322 such that potential difference 328 is created between pair of conductive plates 322 across core 304. For example, alternating current bias voltage 336 may be driven directly across pair of conductive plates 322 with core 304 sandwiched between pair of conductive plates 322. In this manner, conductor system 306 may include at least one of plurality of electrodes 307 positioned at the ends of core 304 or pair of conductive plates 322 positioned around core 304 but dielectrically separated from core 304.

Figure 4:
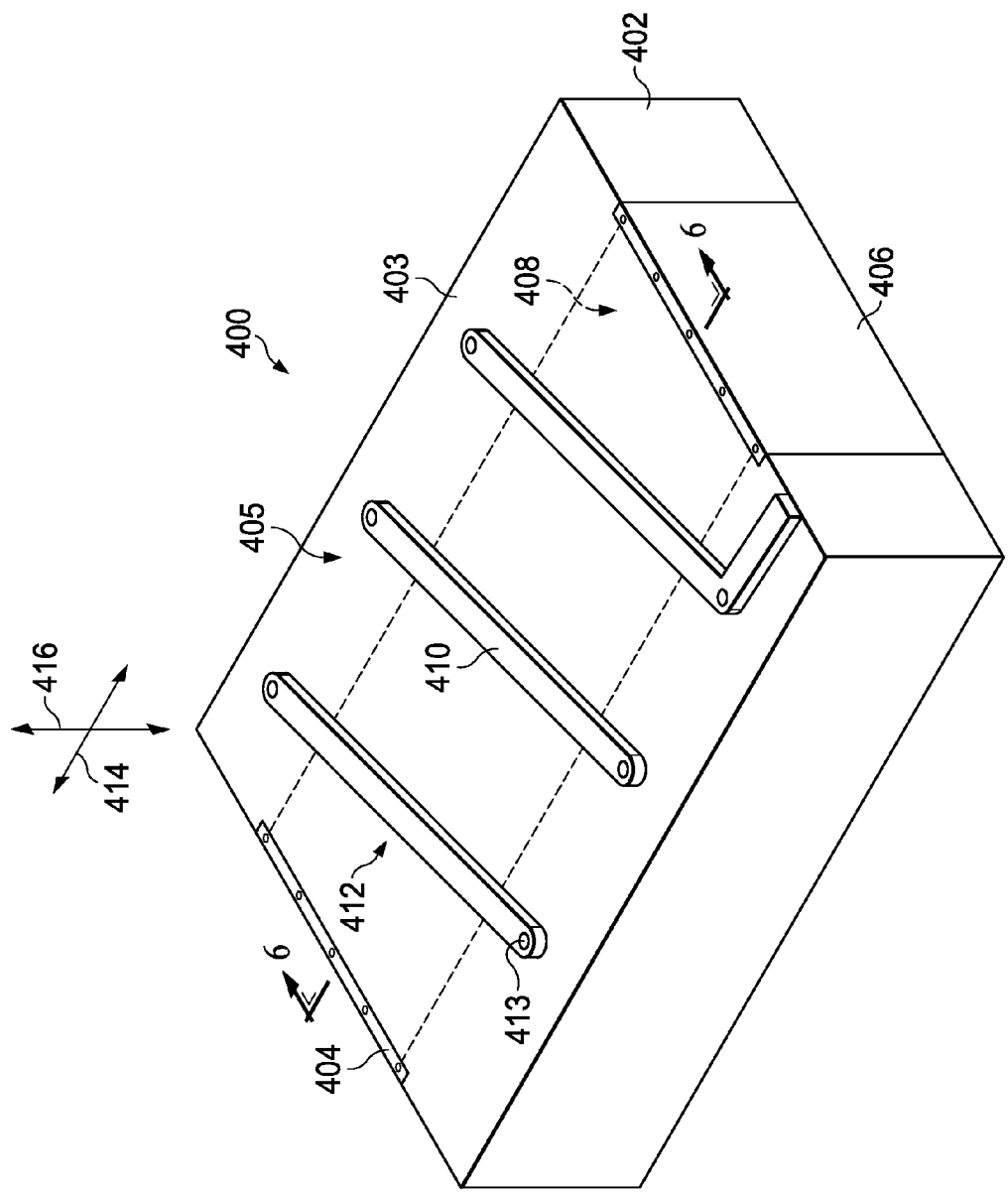
FIG. 4 is an illustration of a top isometric view of an adjustable inductor in accordance with an illustrative embodiment.

With reference now to FIG. 4, an illustration of a top isometric view of an adjustable inductor is depicted in accordance with an illustrative embodiment. In this illustrative example, adjustable inductor 400 may be an example of one implementation for adjustable inductor 200 in FIG. 2.

As depicted, dielectric substrate 402 serves as a base for adjustable inductor 400. Dielectric substrate 402 may be an example of one implementation for dielectric substrate 202 in FIG. 2. Dielectric substrate 402 has outer surface 403. Top side 405 of outer surface 403 may be seen in this illustrative example.

Adjustable inductor 400 may include first electrode 404, second electrode 406, core 408, and conductor 410. First electrode 404, second electrode 406, and core 408 may be examples of implementations for first electrode 214, second electrode 216, and core 204, respectively, in FIG. 2. First electrode 404 and second electrode 406 are supported by dielectric substrate 402.

An exposed view of core 408 is shown in FIG. 4. Core 408 is located in a channel (not shown) within dielectric substrate 402 between first electrode 404 and second electrode 406. Core 408 may be comprised of a fluid mixture of both liquid crystals and magnetic nanoparticles.

In this illustrative example, conductor 410 may be implemented using first set of conductive lines 412. First set of conductive lines 412 may be disposed around core 408 but dielectrically separated from core 408 by dielectric substrate 402. Conductor 410 may also include vias 413, which may connect first set of conductive lines 412 to a second set of conductive lines (not shown) on the opposite side of dielectric substrate 402. Vias 413 extend through dielectric substrate 402.

Horizontal axis 414 may be substantially parallel to a longitudinal axis through core 408. Vertical axis 416 may be substantially perpendicular to the longitudinal axis through core 408.

Figure 5:
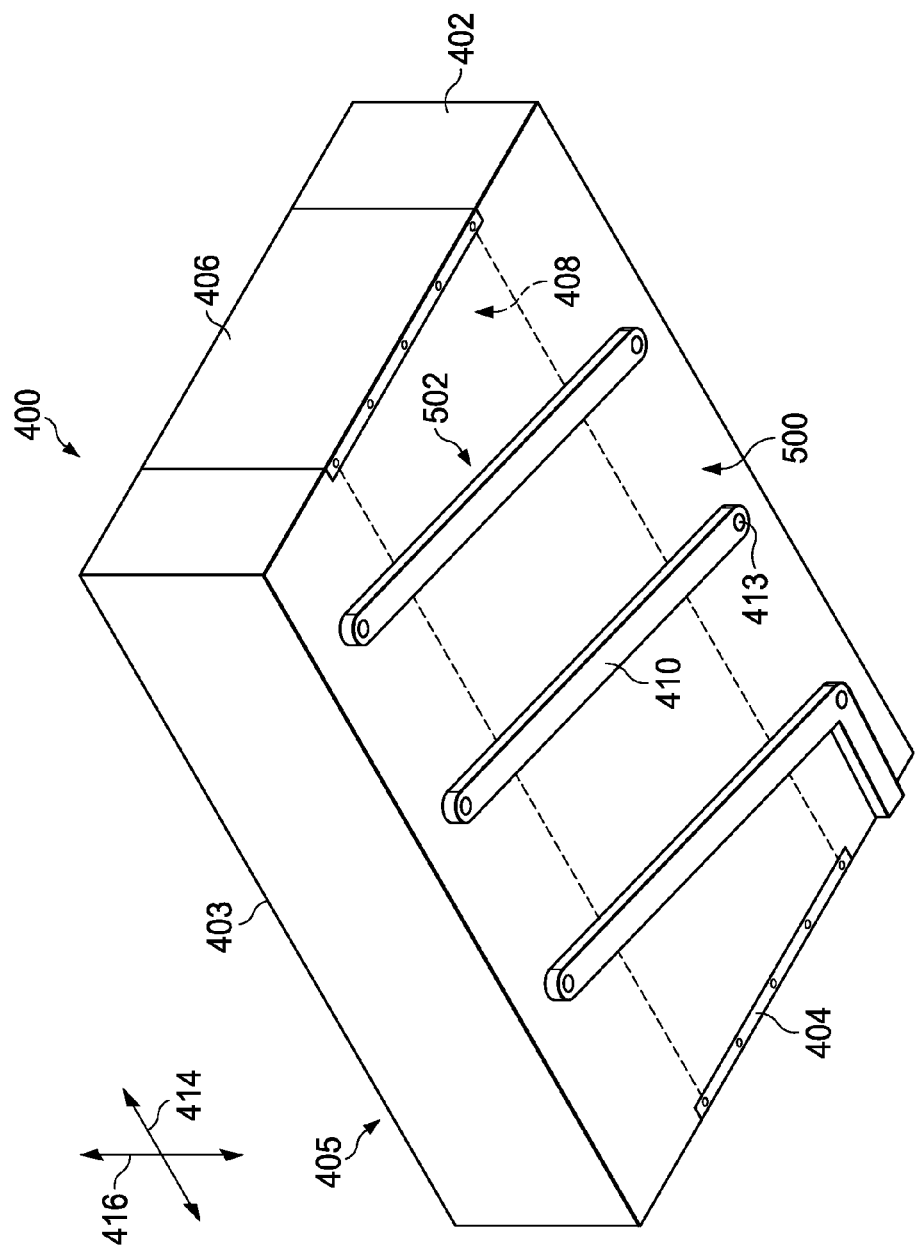
FIG. 5 is an illustration of a bottom isometric view of an adjustable inductor in accordance with an illustrative embodiment.

With reference now to FIG. 5, an illustration of a bottom isometric view of adjustable inductor 400 from FIG. 4 is depicted in accordance with an illustrative embodiment. In this illustrative example, bottom side 500 of outer surface 403 may be seen.

Further, second set of conductive lines 502 are shown along bottom side 500 of dielectric substrate 402. Second set of conductive lines 502 are electrically and conductively connected to first set of conductive lines 412 in FIG. 4 through vias 413 that pass through dielectric substrate 402.

Figure 6:
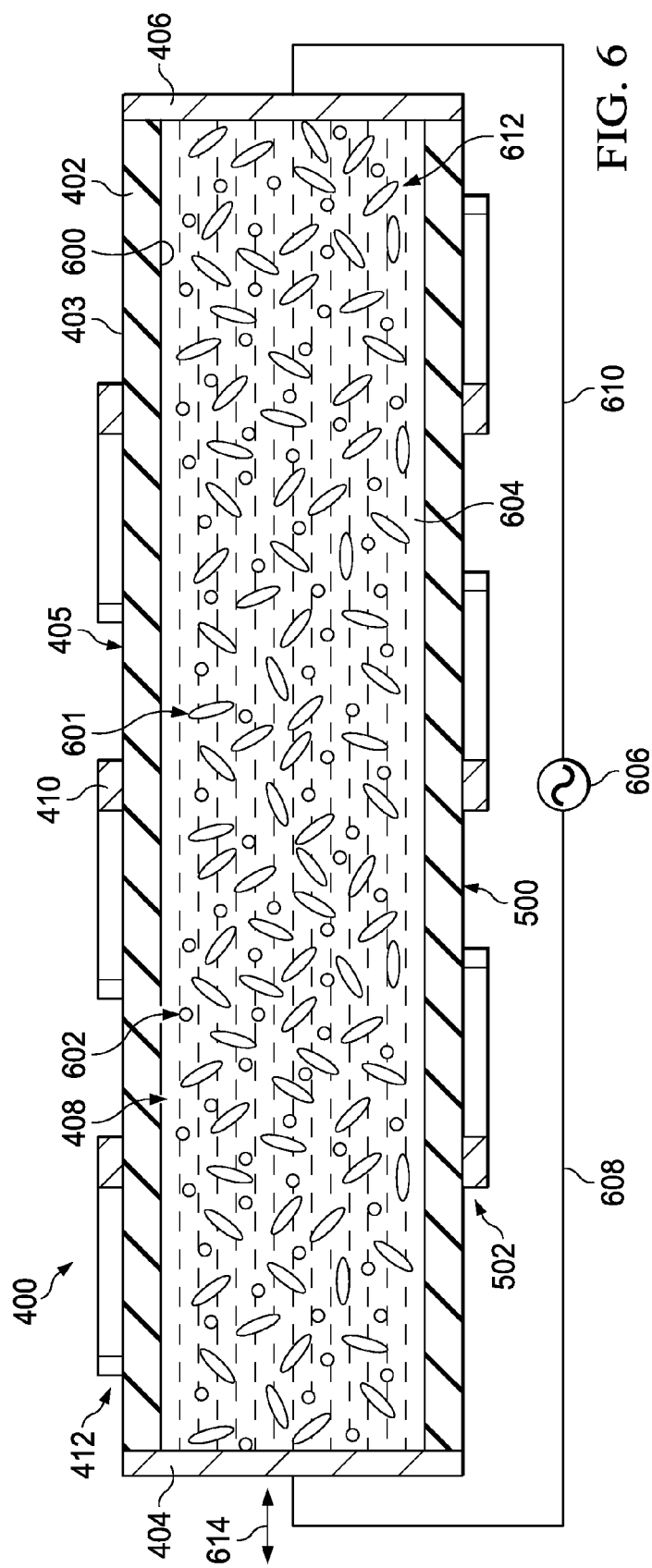
FIG. 6 is an illustration of a cross-sectional view of an adjustable inductor and a dielectric substrate in accordance with an illustrative embodiment.

With reference now to FIG. 6, an illustration of a cross-sectional view of adjustable inductor 400 and dielectric substrate 402 from FIG. 4 is depicted in accordance with an illustrative embodiment. In this illustrative example, a cross-sectional view of adjustable inductor 400 and dielectric substrate 402 is shown taken along the direction of lines 6-6 in FIG. 6.

As depicted, channel 600 may be present within dielectric substrate 402 between first electrode 404 and second electrode 406. Core 408 is located within channel 600. In this illustrative example, core 408 comprises plurality of liquid crystals 601 and plurality of magnetic nanoparticles 602. Together, plurality of liquid crystals 601 and plurality of magnetic nanoparticles 602 form fluid mixture 604.

Voltage controller 606 is electrically connected to adjustable inductor 400. In particular, voltage controller 606 is electrically connected to first electrode 404 through lead line 608 and to second electrode 406 through lead line 610. Voltage controller 606 may be an example of one implementation for voltage controller 224 in FIG. 2.

In this illustrative example, voltage controller 606 applies a voltage to first electrode 404 and second electrode 406 to create a potential difference between first electrode 404 and second electrode 406 across core 408. Changing the voltage applied to first electrode 404 and second electrode 406 may change the potential difference across core 408, which may change the magnetic permeability of core 408. A change in the magnetic permeability of core 408 may affect the inductance of conductor 407 of adjustable inductor 400.

In this illustrative example, when no voltage is applied to first electrode 404 or second electrode 406, plurality of liquid crystals 601 and plurality of magnetic nanoparticles 602 may have random alignment 612. When a voltage is applied to first electrode 404 and second electrode 406, plurality of liquid crystals 601 and plurality of magnetic nanoparticles 602 may align with respect to longitudinal axis 614 through core 408.

Figure 7:
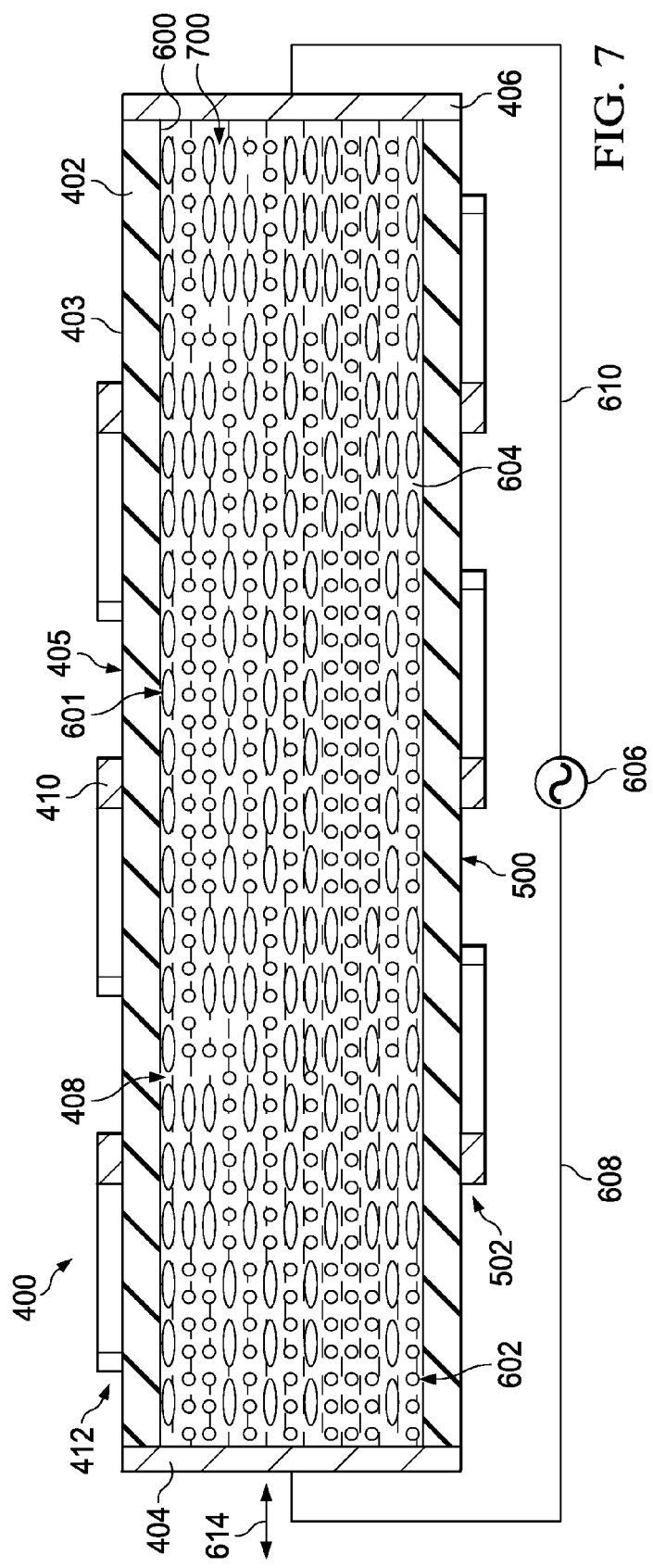
FIG. 7 is an illustration of an alignment of liquid crystals and magnetic nanoparticles within a core in accordance with an illustrative embodiment.

With reference now to FIG. 7, an illustration of an alignment of liquid crystals and magnetic nanoparticles within core 408 from FIG. 6 is depicted in accordance with an illustrative embodiment. In this illustrative example, voltage controller 606 has applied a voltage to first electrode 404 and second electrode 406 to create a potential difference across core 408.

Applying voltage to first electrode 404 and second electrode 406 causes plurality of liquid crystals 601 to align substantially parallel to longitudinal axis 614. Further, alignment of plurality of liquid crystals 601 causes co-alignment of plurality of magnetic nanoparticles 602. In this manner, plurality of liquid crystals 601 and plurality of magnetic nanoparticles may have ordered alignment 700.

Figure 8:
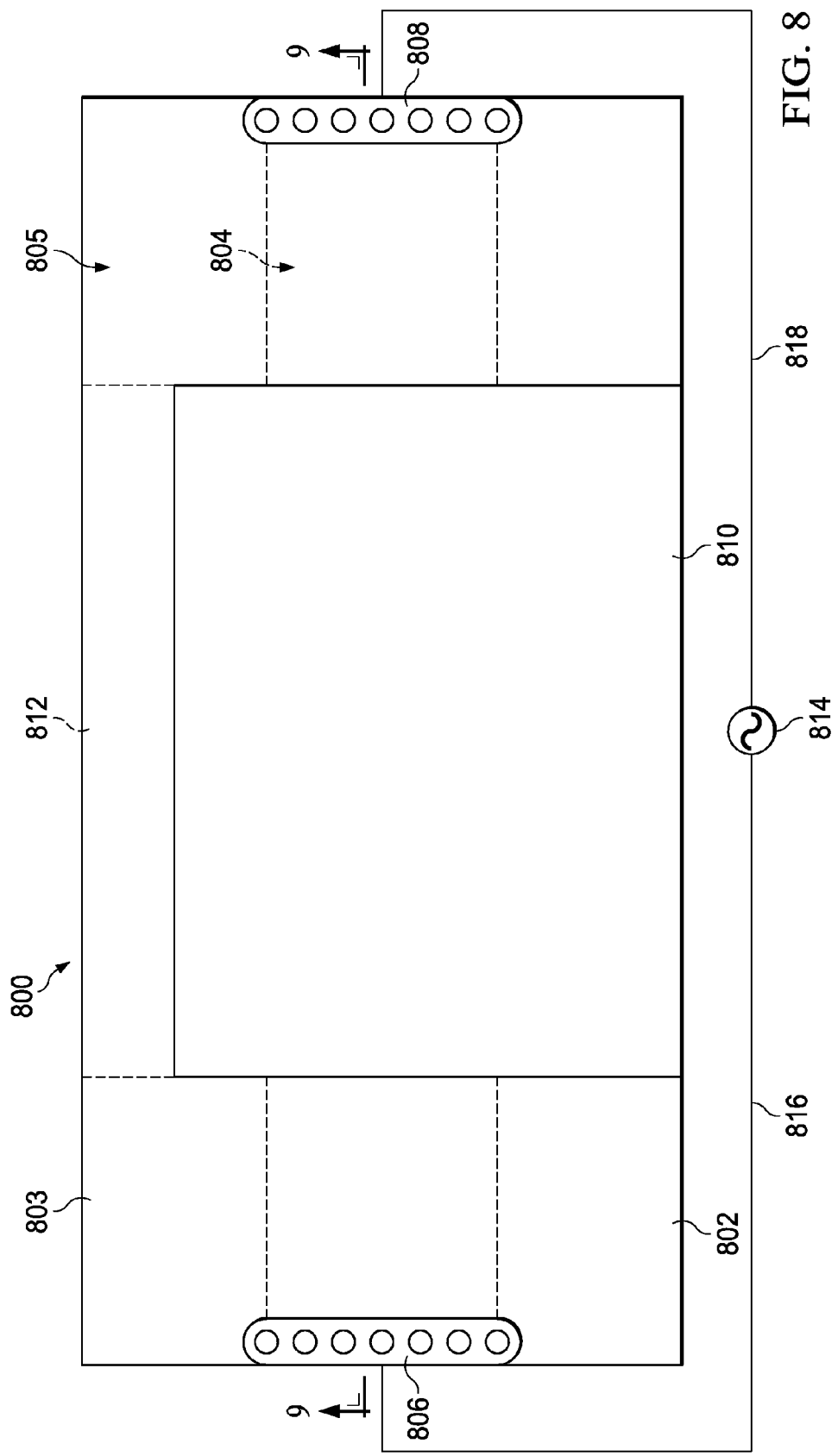
FIG. 8 is an illustration of a top view of an adjustable capacitor in accordance with an illustrative embodiment.

Turning now to FIG. 8, an illustration of a top view of an adjustable capacitor is depicted in accordance with an illustrative embodiment. In this illustrative example, adjustable capacitor 800 may be an example of one implementation for adjustable capacitor 300 in FIG. 3.

As depicted, dielectric substrate 802 serves a as a base for adjustable capacitor 800. Dielectric substrate 802 may be an example of one implementation for dielectric substrate 302 in FIG. 3. Dielectric substrate 802 has outer surface 803. Top side 805 of outer surface 803 is shown in FIG. 8.

In this illustrative example, an exposed view of core 804 within dielectric substrate 802 is shown. Core 804 may be an example of one implementation for core 304 in FIG. 3.

First electrode 806 and second electrode 808 are supported by dielectric substrate 802 and positioned relative to core 804. First electrode 806 and second electrode 808 may be examples of implementations for first electrode 314 and second electrode 316, respectively, in FIG. 3.

In this illustrative example, conductive plate 810 and conductive plate 812 form a pair of conductive plates. Conductive plate 810 and conductive plate 812 may be an example of one implementation for pair of conductive plates 322 in FIG. 3.

Conductive plate 810 is positioned at top side 805 of outer surface 803 of dielectric substrate 802. Conductive plate 812, which is shown in an exposed view, may be positioned at a bottom side (not shown) of outer surface 803 of dielectric substrate 802. In this manner, conductive plate 810 and conductive plate 812 are separated by dielectric substrate 802 and core 804 within dielectric substrate 802. Dielectric substrate 802 may dielectrically separate conductive plate 810 and conductive plate 812 from core 804.

Voltage controller 814 may be electrically connected to first electrode 806 through lead line 816 and electrically connected to second electrode 808 through lead line 818. Voltage controller 814 may be used to apply a voltage to first electrode 806 and second electrode 808, which may create a potential difference across core 804. This potential difference may produce a net change in the permittivity of core 804. Changes in the voltage applied to first electrode 806 and second electrode 808 may change the permittivity of core 804, which may result in changes in the capacitance of conductive plate 810 and conductive plate 812.

In other illustrative examples, voltage controller 814 may be configured to drive an alternating current bias voltage directly across conductive plate 810 and conductive plate 812 with core 804 sandwiched between these two conductive plates. In these examples, first electrode 806 and second electrode 808 may be optionally omitted from adjustable capacitor 800.

Figure 9:
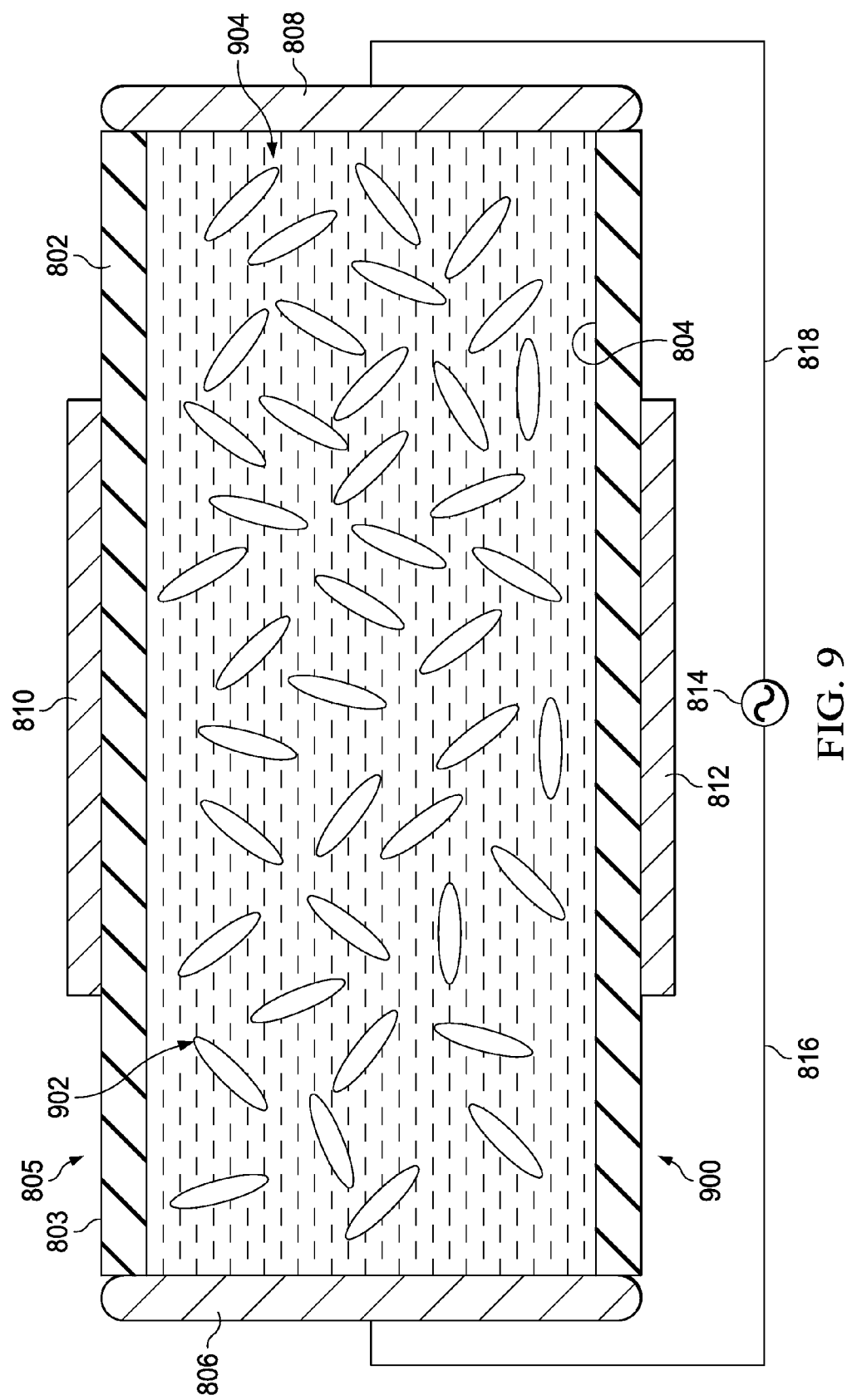
FIG. 9 is an illustration of a cross-sectional view of an adjustable capacitor and a dielectric substrate in accordance with an illustrative embodiment.

With reference now to FIG. 9, an illustration of a cross-sectional view of adjustable capacitor 800 and dielectric substrate 802 from FIG. 8 is depicted in accordance with an illustrative embodiment. In this illustrative example, a cross-sectional view of adjustable capacitor 800 and dielectric substrate 802 is taken in the direction of lines 9-9 in FIG. 8.

Bottom side 900 of outer surface 803 of dielectric substrate 802 is shown in this illustrative example. Conductive plate 812 is positioned at bottom side 900 of dielectric substrate 802 and conductive plate 810 is positioned at top side 805 of dielectric substrate 802. In this manner, conductive plate 812 and conductive plate 810 may be positioned around core 804 but dielectrically separated from core 804 by dielectric substrate 802.

As depicted, core 804 may be comprised of a fluid formed by plurality of liquid crystals 902. In this illustrative example, when no voltage is being applied to first electrode 806 and second electrode 808, plurality of liquid crystals 902 have random orientation 904.

Figure 10:
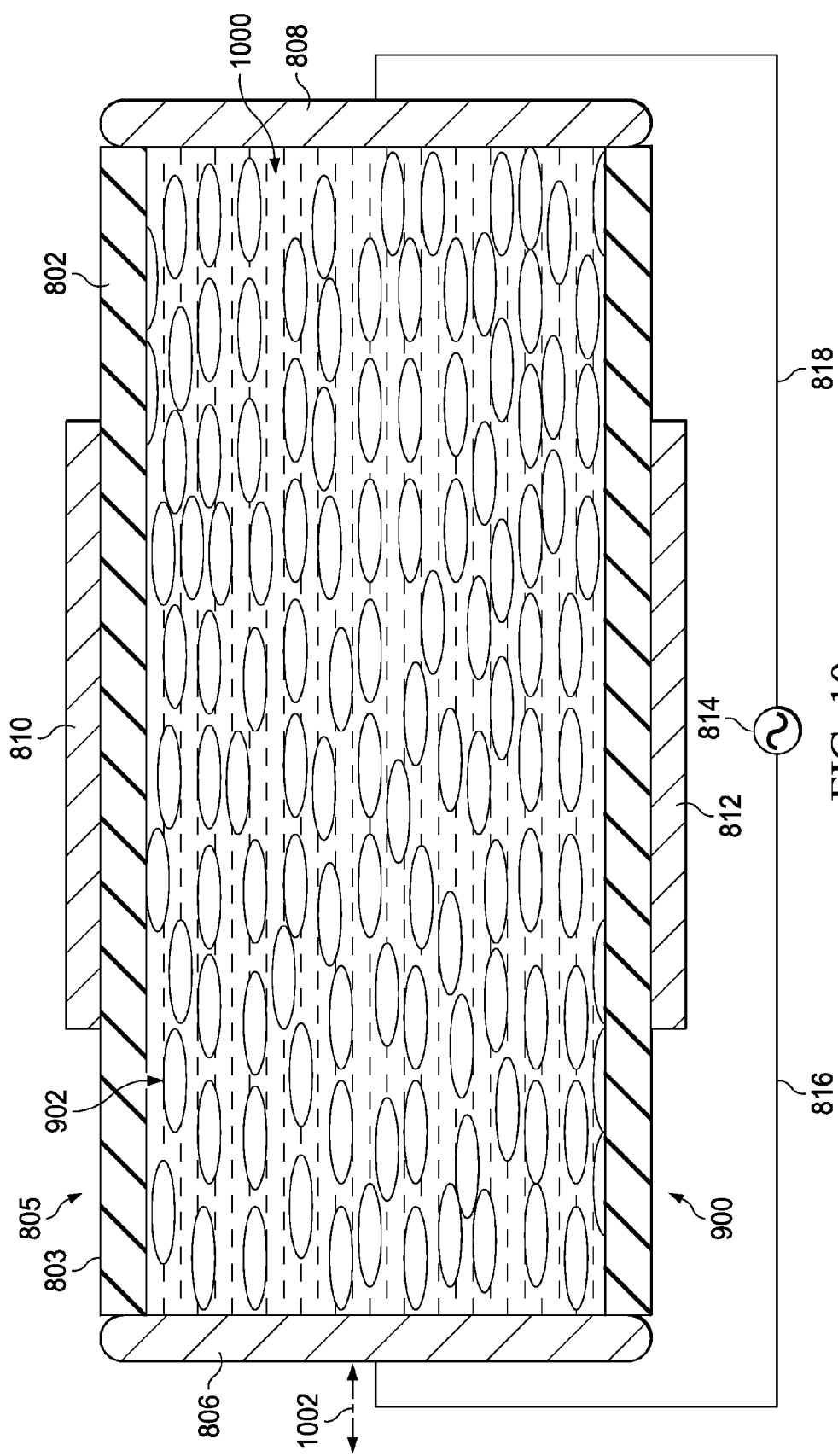
FIG. 10 is an illustration of an alignment of liquid crystals within a core in accordance with an illustrative embodiment.

Turning now to FIG. 10, an illustration of an alignment of liquid crystals within core 804 from FIG. 9 is depicted in accordance with an illustrative embodiment. In this illustrative example, voltage controller 814 is applying a voltage to first electrode 806 and second electrode 808. Consequently, plurality of liquid crystals 902 are forced into ordered alignment 1000. In particular, plurality of liquid crystals 902 may align substantially parallel to longitudinal axis 1002 through core 804.

Figure 11:
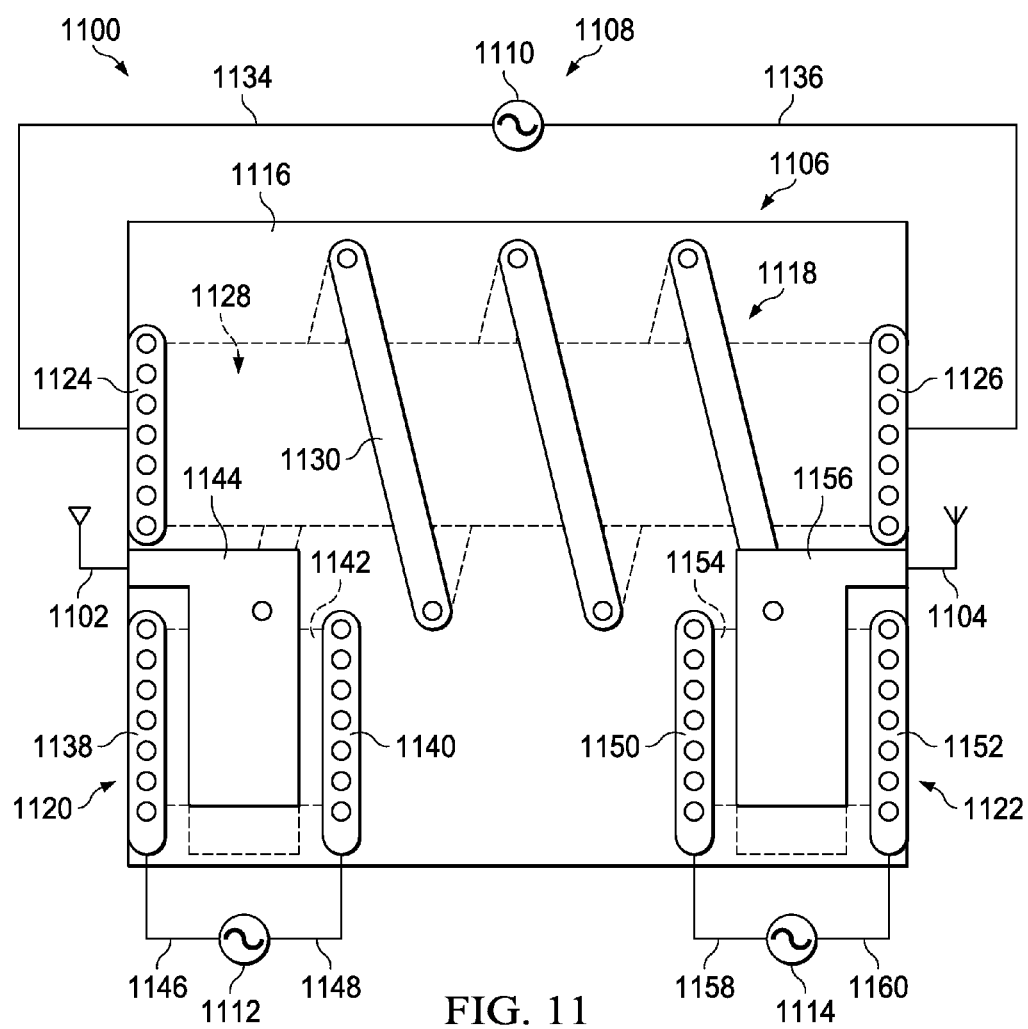
FIG. 11 is an illustration of a top view of an impedance matching and filtering network in accordance with an illustrative embodiment.

With reference now to FIG. 11, an illustration of a top view of an impedance matching and filtering network is depicted in accordance with an illustrative embodiment. In this illustrative example, impedance matching and filtering network 1100 may be an example of one implementation for impedance matching and filtering network 122 in FIG. 1.

As depicted, impedance matching and filtering network 1100 receives an input from transmitter 1102, generates an output based on this input, and sends an output to antenna 1104. The input received from transmitter 1102 may be the output produced by transmitter 1102. This input may be approximated as a current source. In this illustrative example, impedance matching and filtering network 1100 may filter the input received from transmitter 1102 and may match the impedance of transmitter 1102 to the impedance of the load of antenna 1104 to improve overall power transfer between transmitter 1102 and antenna 1104.

Impedance matching and filtering network 1100 takes the form of pi-network 1106 in this illustrative example. As depicted, impedance matching and filtering network 1100 includes voltage control system 1108, which may be an example of one implementation for voltage control system 136 in FIG. 1. Voltage control system 1108 includes voltage controller 1110, voltage controller 1112, and voltage controller 1114. Voltage controller 1110, voltage controller 1112, and voltage controller 1114 may be an example of one implementation for number of voltage controllers 138 in FIG. 1.

Impedance matching and filtering network 1100 is supported by dielectric substrate 1116. Dielectric substrate 1116 may be an example of one implementation for base 132 in FIG. 1. Impedance matching and filtering network 1100 includes adjustable inductor 1118, adjustable capacitor 1120, and adjustable capacitor 1122. Dielectric substrate 1116 serves as a base for each of adjustable inductor 1118, adjustable capacitor 1120, and adjustable capacitor 1122.

As depicted, adjustable inductor 1118, adjustable capacitor 1120, and adjustable capacitor 1122 are configured in a manner that resembles the shape of the pi (n) symbol. Adjustable inductor 1118 may be an example of one implementation for adjustable inductor 200 in FIG. 2. Adjustable capacitor 1120 and adjustable capacitor 1122 may be examples of implementations for adjustable capacitor 300 in FIG. 3.

Adjustable inductor 1118 includes first electrode 1124, second electrode 1126, core 1128, and conductor 1130. Core 1128 is located in a channel within dielectric substrate 1116. Core 1128 may be comprised of a fluid mixture of liquid crystals and magnetic nanoparticles. Conductor 1130 is disposed around core 1128 but dielectrically separated from core 1128.

Voltage controller 1110 is electrically connected to first electrode 1124 by lead line 1134 and to second electrode 1126 by lead line 1136. Voltage controller 1110 controls the voltage applied to first electrode 1124 and second electrode 1126.

Adjustable capacitor 1120 includes first electrode 1138, second electrode 1140, core 1142, and pair of conductive plates 1144. Core 1142 is located in another channel within dielectric substrate 1116. Core 1142 may be comprised of a fluid containing only liquid crystals. Pair of conductive plates 1144 are arranged in parallel around core 1142 but kept dielectrically separated from core 1142 by dielectric substrate 1116.

Voltage controller 1112 is electrically connected to first electrode 1138 by lead line 1146 and to second electrode 1140 by lead line 1148. Voltage controller 1112 controls the voltage applied to first electrode 1138 and second electrode 1140.

Adjustable capacitor 1122 includes first electrode 1150, second electrode 1152, core 1154, and pair of conductive plates 1156. Core 1154 is located in yet another channel within dielectric substrate 1116. Core 1154 may be comprised of a fluid containing only liquid crystals. Pair of conductive plates 1156 are arranged in parallel around core 1154 but kept dielectrically separated from core 1154 by dielectric substrate 1116.

Voltage controller 1114 is electrically connected to first electrode 1150 by lead line 1158 and to second electrode 1152 by lead line 1160. Voltage controller 1114 controls the voltage applied to first electrode 1150 and second electrode 1152.

The voltages applied to the electrodes of adjustable inductor 1118, adjustable capacitor 1120, and adjustable capacitor 1122 may be controlled by voltage controller 1110, voltage controller 1112, and voltage controller 1114, respectively, to provide adaptive impedance matching and adaptive filtering. In particular, using a mixture of liquid crystals and magnetic nanoparticles within core 1128 of adjustable inductor 1118 may enable fast signal response that may be faster than cutoff frequencies, without compromising performance.

When an input is received from transmitter 1102, an electric current passes through pair of conductive plates 1144, through conductor 1130, and through pair of conductive plates 1156 before leaving impedance matching and filtering network 1100. Using adjustable inductor 1118, adjustable capacitor 1120, and adjustable capacitor 1122 may reduce the cost, size, and weight of impedance matching and filtering network 1100, while enabling desired performance with respect to adaptive impedance matching and adaptive filtering.

The illustrations of adjustable inductor 400 in FIGS. 4-7, adjustable capacitor 800 in FIGS. 8-10, and impedance matching and filtering network 1100 in FIG. 11 are not meant to imply physical or architectural limitations to the manner in which an illustrative embodiment may be implemented. Other components in addition to or in place of the ones illustrated may be used. Some components may be optional.

The different components shown in FIGS. 4-11 may be illustrative examples of how components shown in block form in FIGS. 1-3 can be implemented as physical structures. Additionally, some of the components in FIGS. 4-11 may be combined with components in FIG. 1-3, used with components in FIGS. 1-3, or a combination of the two.

Figure 12:
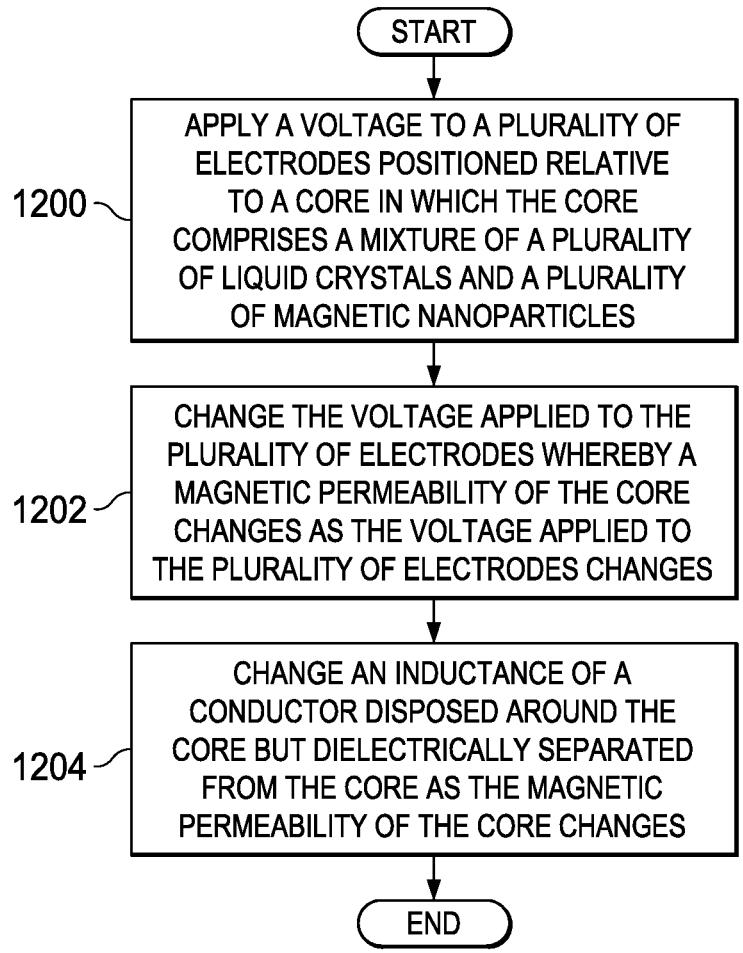
FIG. 12 is an illustration of a process for managing a magnetic permeability of a core in the form of a flowchart in accordance with an illustrative embodiment.

With reference now to FIG. 12, an illustration of a process for managing a magnetic permeability of a core is depicted in the form of a flowchart in accordance with an illustrative embodiment. The process illustrated in FIG. 12 may be used to manage the magnetic permeability of a core of an adjustable inductor, such as core 204 of adjustable inductor 200 in FIG. 2.

The process may begin by applying a voltage to a plurality of electrodes positioned relative to a core in which the core comprises a mixture of a plurality of liquid crystals and a plurality of magnetic nanoparticles (operation 1200). The voltage applied to the plurality of electrodes may be changed, whereby a magnetic permeability of the core changes as the voltage applied to the plurality of electrodes changes (operation 1202). An inductance of a conductor disposed around the core but dielectrically separated from the core changes as the magnetic permeability of the core changes (operation 1204), with the process terminating thereafter.

In particular, in operation 1202, changing the voltage changes a first alignment of the plurality of liquid crystals such that a second alignment of the plurality of magnetic nanoparticles changes. The changing of the second alignment of the plurality of magnetic nanoparticles changes the magnetic permeability of the core. Further, when the core is implemented as part of an adjustable inductor in which a conductor is disposed around the core, changing the magnetic permeability of the core thereby changes an inductance of the conductor.

Figure 13:
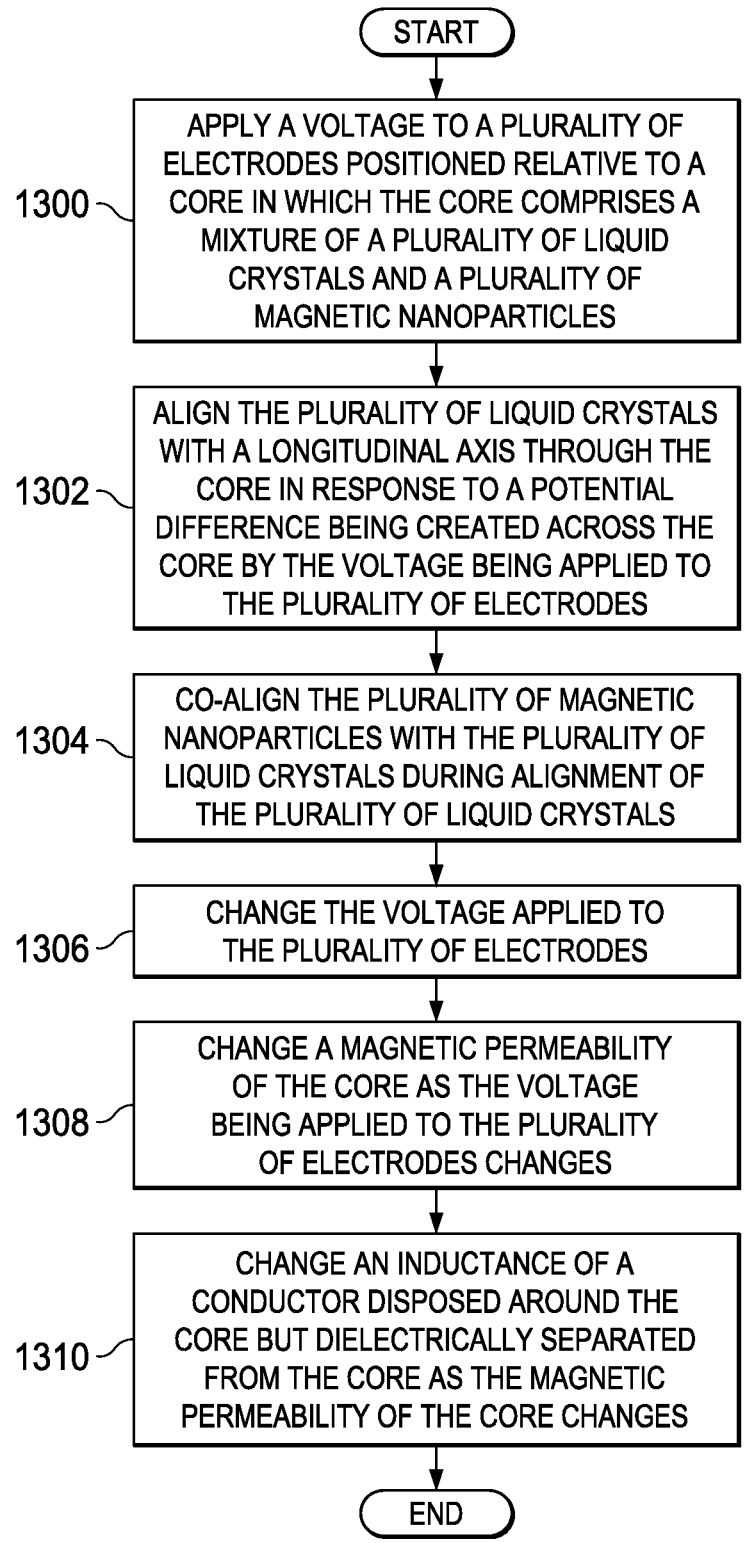
FIG. 13 is an illustration of a process for managing an adjustable inductor in the form of a flowchart in accordance with an illustrative embodiment.

With reference now to FIG. 13, an illustration of a process for managing an adjustable inductor is depicted in the form of a flowchart in accordance with an illustrative embodiment. The process illustrated in FIG. 13 may be implemented to manage adjustable inductor 200 in FIG. 2.

The process may begin by applying a voltage to a plurality of electrodes positioned relative to a core in which the core comprises a mixture of a plurality of liquid crystals and a plurality of magnetic nanoparticles (operation 1300). The plurality of liquid crystals may be aligned with a longitudinal axis through the core in response to a potential difference being created across the core by the voltage being applied to the plurality of electrodes (operation 1302). Further, the plurality of magnetic nanoparticles may be co-aligned with the plurality of liquid crystals during alignment of the plurality of liquid crystals (operation 1304). The voltage applied to the plurality of electrodes is changed (operation 1306).

A magnetic permeability of the core changes as the voltage being applied to the plurality of electrodes changes (operation 1308). An inductance of a conductor disposed around the core but dielectrically separated from the core changes as the magnetic permeability of the core changes (operation 1310), with the process terminating thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Thus, the illustrative embodiments provide a method and apparatus for managing a magnetic permeability of a core of an adjustable inductor to thereby manage the inductance of the adjustable inductor. In one illustrative example, a voltage is applied to a plurality of electrodes positioned relative to a core. The core may comprise a mixture of a plurality of liquid crystals and a plurality of magnetic nanoparticles. The voltage applied to the plurality of electrodes may be changed. The magnetic permeability of the core changes as the voltage applied to the plurality of electrodes changes. Further, the overall inductance of the adjustable inductor changes as the magnetic permeability of the core changes.

The illustrative embodiments provide a method and apparatus that may facilitate the cost-effective fabrication of wideband adaptive impedance matching and filtering networks. Further, the type of adjustable inductor described by the illustrative embodiments may improve overall performance of radio frequency (RF) systems and may reduce power consumption as compared to currently available inductors.

The adjustable inductor described by the illustrative embodiments may enable an impedance matching and filtering network to be made smaller and lighter. Further, this adjustable inductor may simplify the mechanical structures and assembly process needed for the impedance matching and filtering network by reducing the number of circuit components required.

The adjustable inductor and adjustable capacitor described by the illustrative embodiments may be particularly useful in forming circuit networks in various systems that operate at radio frequencies. These systems may include, but are not limited to, cellular phones, satellite communications systems, televisions, radar imaging systems, and other types of systems that operate at radio frequencies.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a core comprising a plurality of liquid crystals and a plurality of magnetic nanoparticles;
a plurality of electrodes positioned relative to the core, wherein changing a voltage applied to the plurality of electrodes changes a magnetic permeability of the core;
a conductor disposed around the core, wherein the core, the plurality of electrodes, and the conductor form an adjustable inductor; and
a dielectric substrate that serves as a base for the plurality of electrodes and the conductor, wherein the core is located in a channel within the dielectric substrate.

2. The apparatus of claim 1, wherein changing the voltage applied to the plurality of electrodes changes the magnetic permeability of the core and thereby, an inductance of the adjustable inductor.

3. The apparatus of claim 1, wherein the adjustable inductor belongs to at least one of a filtering circuit, an impedance matching circuit, or an impedance matching and filtering circuit.

4. The apparatus of claim 1, further comprising:
a number of adjustable capacitors electrically connected to the adjustable inductor.

5. The apparatus of claim 1 further comprising:
a voltage controller that generates and controls the voltage, wherein changing at least one of a peak or a frequency of the voltage changes the magnetic permeability of the core.

6. The apparatus of claim 1, wherein the voltage is an alternating current bias voltage.

7. The apparatus of claim 1, wherein the plurality of electrodes comprises:
a first electrode positioned relative to a first end of the core; and
a second electrode positioned relative to a second end of the core.

8. An apparatus comprising:
an adjustable inductor comprising:
a core that comprises a fluid mixture of a plurality of liquid crystals and a plurality of magnetic nanoparticles;
a plurality of electrodes positioned relative to the core;
a conductor disposed around the core, wherein changing a voltage applied to the plurality of electrodes changes a magnetic permeability of the core and thereby, an inductance of the conductor; and
a dielectric substrate that serves as a base for the adjustable inductor, wherein the core is located in a channel within the dielectric substrate.

9. The apparatus of claim 8, wherein the voltage is a first voltage and further comprising:
an adjustable capacitor comprising:
a capacitor core comprising a plurality of liquid crystals; and
a conductor system positioned relative to the capacitor core, wherein changing a second voltage applied to the conductor system changes a permittivity of the capacitor core and thereby, a capacitance of the conductor system.

10. The apparatus of claim 9, wherein the conductor system comprises at least one of the plurality of electrodes positioned at ends of the capacitor core or a pair of conductive plates positioned around the core but dielectrically separated from the capacitor core.

11. The apparatus of claim 9
wherein the core of the adjustable inductor is located in a channel within the dielectric substrate; and wherein the adjustable inductor is one of a number of adjustable inductors associated with the dielectric substrate and the adjustable capacitor is one of a number of adjustable capacitors associated with the dielectric substrate.

12. The apparatus of claim 11 further comprising:
a voltage control system that generates and controls the first voltage applied to the plurality of electrodes of the adjustable inductor and that generates and controls the second voltage applied to the conductor system of the adjustable capacitor.

13. The apparatus of claim 12, wherein the number of adjustable inductors, the number of adjustable capacitors, and the voltage control system form at least one of a filtering circuit, an impedance matching circuit, or an impedance matching and filtering circuit.

14. The apparatus of claim 13, wherein the filtering circuit comprises at least one of a high-pass filter circuit, a low-pass filter circuit, a multi-pass filter circuit, an all-pass filter circuit, a band-pass filter circuit, or a notch filter circuit.

15. A method for managing a magnetic permeability of a core, the method comprising:
applying a voltage to a plurality of electrodes positioned relative to a core, wherein the core comprises a plurality of liquid crystals and a plurality of magnetic nanoparticles;
changing the voltage applied to the plurality of electrodes, wherein the magnetic permeability of the core changes as the voltage applied to the plurality of electrodes changes; and
changing a first alignment of the plurality of liquid crystals such that a second alignment of the plurality of magnetic nanoparticles changes to thereby change an inductance of a conductor disposed around the core.

16. The method of claim 15, wherein changing the voltage comprises:
changing a first alignment of the plurality of liquid crystals such that a second alignment of the plurality of magnetic nanoparticles changes to thereby change the magnetic permeability of the core.

\* \* \* \* \*